US009729044B2

(12) United States Patent
Ishino et al.

(10) Patent No.: US 9,729,044 B2
(45) Date of Patent: Aug. 8, 2017

(54) POWER CONVERSION DEVICE HAVING TWO SERIALLY-CONNECTED SWITCHING ELEMENTS

(71) Applicant: DENSO CORPORATION, Kariya, Aichi-pref. (JP)

(72) Inventors: Hiroshi Ishino, Kariya (JP); Yousuke Jinsei, Kariya (JP); Atsushi Ikegame, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/915,290

(22) PCT Filed: Sep. 1, 2014

(86) PCT No.: PCT/JP2014/004463
§ 371 (c)(1),
(2) Date: Feb. 29, 2016

(87) PCT Pub. No.: WO2015/037203
PCT Pub. Date: Mar. 19, 2015

(65) Prior Publication Data
US 2016/0211741 A1   Jul. 21, 2016

(30) Foreign Application Priority Data

Sep. 10, 2013   (JP) ................................ 2013-187550

(51) Int. Cl.
*H02M 7/537*   (2006.01)
*H02M 1/34*   (2007.01)
(Continued)

(52) U.S. Cl.
CPC ............ *H02M 1/34* (2013.01); *H02M 7/003* (2013.01); *H02M 7/537* (2013.01); *H05K 7/209* (2013.01);
(Continued)

(58) Field of Classification Search
None
See application file for complete search history.

(56) References Cited

U.S. PATENT DOCUMENTS

| 2003/0022464 A1 | 1/2003 | Hirano et al. |
| 2004/0183188 A1* | 9/2004 | Oohama ............. H01L 23/3107 257/706 |

(Continued)

FOREIGN PATENT DOCUMENTS

| JP | H09-215343 A | 8/1997 |
| JP | 2003-124406 A | 4/2003 |

(Continued)

OTHER PUBLICATIONS

International Search Report and Written Opinion of the International Searching Authority dated Nov. 18, 2014 Issued in the corresponding International Application No. PCT/JP2014/004463 (and English translation).

*Primary Examiner* — Jeffrey Gblende
(74) *Attorney, Agent, or Firm* — Posz Law Group, PLC

(57) ABSTRACT

A power conversion device is capable of achieving three requirements to restrict a surge voltage, ensure high radiation performance of SW elements, and restrict ringing at the same time. In a power conversion device, element modules of two SW elements are stacked in a thickness direction via an insulating layer in such a manner that lateral surfaces are aligned parallel to each other in a same orientation, and a positive terminal of one SW element and a negative terminal of the other SW element are disposed so as to overlap each other in the thickness direction.

16 Claims, 13 Drawing Sheets

(51) Int. Cl.
  *H02M 7/00*  (2006.01)
  *H05K 7/20*  (2006.01)
(52) U.S. Cl.
  CPC .......... *H01L 2224/05554* (2013.01); *H01L 2224/40137* (2013.01); *H01L 2224/48247* (2013.01); *H01L 2924/181* (2013.01); *H02M 2001/348* (2013.01)

(56) References Cited

U.S. PATENT DOCUMENTS

| | | | | |
|---|---|---|---|---|
| 2006/0232942 | A1* | 10/2006 | Nakatsu | B60L 11/08 |
| | | | | 361/710 |
| 2010/0090668 | A1* | 4/2010 | Girdhar | H01L 23/645 |
| | | | | 323/282 |
| 2012/0218716 | A1* | 8/2012 | Asakura | H01L 23/4006 |
| | | | | 361/717 |
| 2013/0003305 | A1* | 1/2013 | Stella | H01L 23/49562 |
| | | | | 361/709 |

FOREIGN PATENT DOCUMENTS

| | | |
|---|---|---|
| JP | 2005-287267 A | 10/2005 |
| JP | 2008-218455 A | 9/2008 |
| JP | 2009-100514 A | 5/2009 |
| JP | 2009-130044 A | 6/2009 |
| JP | 2009-225612 A | 10/2009 |
| JP | 2010-153527 A | 7/2010 |

* cited by examiner

POWER CONVERSION DEVICE HAVING TWO SERIALLY-CONNECTED SWITCHING ELEMENTS

CROSS REFERENCE TO RELATED APPLICATION

This application is a U.S. national stage of International Application No. PCT/JP2014/004463 filed on Sep. 1, 2014 and is based on Japanese Patent Application No. 2013-187550 filed on Sep. 10, 2013, the disclosure of which is incorporated herein by reference.

TECHNICAL FIELD

The present disclosure relates to a power conversion device which includes two serially-connected switching elements (hereinafter, referred to as the SW elements) of an upper arm and a lower arm and supplies power to a load from a connection point of the two SW elements by converting a voltage and a current from a DC power supply.

BACKGROUND ART

A power conversion device which includes two serially-connected SW elements of an upper arm and a lower arm and supplies power to a load by converting a voltage and a current from a DC power supply is disclosed, for example, in JP2005-287267A (Patent Literature 1).

A power conversion device employed in a vehicle is required to have high power density (compact size and large current) and a small power loss. To this end, a current, a voltage, and a switching speed (hereinafter, referred to as a SW speed) of the SW elements are kept increased. When a current, a voltage, and a SW speed of the SW elements which supplies power are increased, however, a surge voltage occurring at the time of switching is increased. In order to reduce a switching loss (hereinafter, referred to as a SW loss), it is absolutely necessary to restrict the surge voltage. The surge voltage also depends on a value of floating inductance in an interior of a filter capacitor or a power module forming the power conversion device or in a bus bar electrically connecting the foregoing components, and the surge voltage becomes high when the floating inductance is large.

The power conversion device disclosed in Patent Literature 1 includes power modules in each of which the SW element is molded with resin in the shape of a flat rectangular parallelepiped. A positive electrode and a negative electrode are provided on one flat surface of the power module and the other surface forming a heat-sinking plane is connected to a cooling substrate. A positive (upper arm) power module group and a negative (lower arm) power module group are disposed in such a manner that the respective surfaces provided with the electrodes oppose each other at a predetermined interval and form a two-way path in which currents flowing in and out from the respective modules oppose each other. Owing to the location and the configuration of the power modules as above, the power conversion device of Patent Literature 1 restricts a surge voltage to be low by reducing the floating inductance occurring between the power modules.

On the other hand, when a larger current flows, the SW elements generate a larger amount of heat while in use. It thus also becomes necessary to enhance radiation performance of the SW elements. A SW element with excellent radiation performance is disclosed, for example, in JP2003-110064A (Patent Literature 2).

The SW element disclosed in Patent Literature 2 is a double-sided heat-sinking element module. The element module has a structure in which a pair of heat sinks is bonded to both surfaces of a semiconductor chip, for example, via solder layers, and the element module is entirely molded with resin in such a manner that respective outer surfaces of a pair of the heat sinks are exposed. Accordingly, heat can be released from the both surfaces of the semiconductor chip and high radiation performance can be exerted. The element module of Patent Literature 2 is also shaped like a flat rectangular parallelepiped. However, different from the power module in Patent Literature 1, the heat sink exposed to one flat surface forms a positive electrode and the heat sink exposed to the other surface forms a negative electrode.

PRIOR ART LITERATURE

Patent Literature

Patent Literature 1: JP2005-287267A
Patent Literature 2: JP2003-110064A

SUMMARY OF INVENTION

As has been described above, a power conversion device employed in a vehicle or the like is required to have high power density and a small power loss. Accordingly, restriction of a surge voltage becomes a problem as a current, a voltage, and a SW speed of the SW elements are increased. In addition, radiation performance of the SW elements needs to be increased as a current becomes larger. Further, in order to ensure EMC, not only a surge voltage but also ringing, which becomes FM band noises accompanying the surge voltage, has to be restricted.

Hence, the present disclosure is directed to a power conversion device which includes two serially-connected SW elements of an upper arm and a lower arm and supplies power to a load from a connection point of the two SW elements by converting a voltage and a current from a DC power supply. The present disclosure has an object to provide a power conversion device capable of achieving three requirements to restrict a surge voltage, ensure high radiation performance of SW elements, and restrict ringing.

A power conversion device according to a first aspect of the present disclosure includes two serially-connected SW elements of an upper and a lower arm and supplies power to a load from a connection point of the two SW elements by converting a voltage and a current from a DC power supply. Each of the two SW elements is provided by an element module which is molded with resin in a shape of a flat rectangular parallelepiped. In each element module, a heat sink connected to a positive electrode of the SW element is disposed on a flat surface of the rectangular parallelepiped and a heat sink connected to a negative electrode of the SW element is disposed on an opposite flat surface of the rectangular parallelepiped in such a manner that outer surfaces of the heat sinks are exposed. A positive terminal coupled to the heat sink connected to the positive electrode and a negative terminal coupled to the heat sink connected to the negative electrode are extracted from a lateral surface of the flat rectangular parallelepiped so as not to overlap in a thickness direction of the rectangular parallelepiped.

The element modules of the two SW elements are stacked in the thickness direction via an insulating layer in such a manner that the lateral surface of one of the two SW elements and the lateral surface of the other of the two SW elements, from each of which the positive terminal and the negative terminal are extracted, are aligned parallel to each other in a same orientation. The positive terminal of the one of the SW elements and the negative terminal of the other of the SW elements are disposed so as to overlap each other in the thickness direction. In one set of the positive terminal and the negative terminal disposed so as to overlap, the positive terminal and the negative terminal are electrically connected in a vicinity of the lateral surfaces of the two SW elements to provide an output terminal (hereinafter, referred to as the O terminal) connected to the load. In the other set of the positive terminal and the negative terminal disposed so as to overlap, the positive terminal of the SW element of the upper arm provides a high-potential terminal (hereinafter, referred to as the P terminal) to be connected to a high potential side of the DC power supply and the negative terminal of the SW element of the lower arm provides a low-potential terminal (hereinafter, referred to as the N terminal) to be connected to a low potential side of the DC power supply.

In order to ensure sufficient radiation performance of the SW elements first, the power conversion device adopts a double-sided heat-sinking element module as follows. That is, the two serially-connected SW elements of the upper arm and the lower arm are formed of the element modules molded with resin in the shape of a flat rectangular parallelepiped. Also, the element modules have a structure in which the heat sink connected to the positive electrode of the SW element is disposed on the one flat surface of the rectangular parallelepiped and the heat sink connected to the negative electrode is disposed on the opposite flat surface in such a manner that the respective outer surfaces are exposed.

By adopting the double-sided heat-sinking element modules as the SW elements, high radiation performance can be exerted in comparison, for example, with a single-sided heat-sinking element module in which a heat sink is disposed on only one surface of the flat rectangular parallelepiped. Also, the element modules are the SW elements of the upper arm and the lower arm, which are separately molded with resin. Hence, the element modules are compact modules in comparison, for example, with a module in which two SW elements of the upper arm and the lower arm are integrally molded with resin or a module in which three SW elements corresponding to respective three phases U, V, and W of the upper arms are integrally molded with resin. Consequently, in a case where the two element modules described below are stacked, the two element modules can be attached at a high degree of accuracy, and even when a temperature rises due to heat generated in the SW elements, deformation caused by warpage or the like becomes smaller.

The power conversion device adopts a structure described below for the respective element modules of the SW elements of the upper arm and the lower arm with the aim of restricting a surge voltage. That is, each element module has a structure in which the positive terminal coupled to the heat sink connected to the positive electrode of the SW element and the negative terminal coupled to the heat sink connected to the negative electrode are extracted from a lateral surface of the flat rectangular parallelepiped so as not to overlap each other in the thickness direction of the rectangular parallelepiped. The two element modules corresponding to the SW elements of the upper arm and the lower arm are stacked in the thickness direction via the insulating layer in such a manner that the lateral surface of the one of the two SW elements and the lateral surface of the other of the two SW elements, from each of which the positive terminal and the negative terminal are extracted, are aligned parallel to each other in the same orientation.

In the stacked state as above, the positive terminal of the one of the two SW elements and the negative terminal of the other of the two SW elements are disposed so as to overlap each other in the thickness direction. That is to say, the positive terminal and the negative terminal are in a locational relation such that the positive terminal and the negative terminal overlap at least partially when projected onto one plane in the thickness direction of the flat rectangular parallelepiped. In the one set of the positive terminal and the negative terminal disposed so as to overlap, the positive terminal and the negative terminal are electrically connected in the vicinity of the lateral surfaces of the two SW elements to provide the O terminal to be connected to the load. In the other set of the positive terminal and the negative terminal disposed so as to overlap, the positive terminal of the SW element of the upper arm provides the P terminal to be connected to a high potential side of the DC power supply and the negative terminal of the SW element of the lower arm provides the N terminal to be connected to a low potential side of the DC power supply.

The locational relation of the two element modules forming the power conversion device is aimed at restricting a surge voltage $\Delta V$ by making inductance Ld of a power-supply circuit smaller. That is to say, in the other set of the positive terminal and the negative terminal disposed so as to overlap, a current flows in an opposite direction at the positive terminal of the SW element of the upper arm forming the P terminal and at the negative terminal of the SW element of the lower arm forming the N terminal. Hence, an effect of reducing inductance by cancelling out magnetic fluxes is exerted. In the one set, too, a current flows in an opposite direction also at the negative terminal of the SW element of the upper arm and the positive terminal of the SW element of the lower arm until the both are electrically connected to form the O terminal. Hence, the inductance reducing effect obtained by canceling out magnetic fluxes is exerted as well. Owing to the inductance reducing effect as above, the power conversion device becomes capable of restricting the surge voltage $\Delta V$ by making the inductance Ld of the power-supply circuit in the power conversion device smaller. Also, magnetic energy stored in the inductance Ld is reduced. Hence, resonance with a latent parasitic capacitance component in an Ld path is damped early and a period during which ringing occurs can be shortened.

As has been described, the two element modules forming the power conversion device are compact modules in which the SW elements of the upper arm and the lower arm are molded separately with resin, and can be attached at a high degree of accuracy. Even when a temperature rises due to heat generated in the SW elements, deformation caused by warpage becomes smaller. In particular, deformation of a metal material, such as the electrodes, becomes smaller, too. Hence, the inductance reducing effect obtained by cancelling out magnetic fluxes described above can be exerted in a reliable manner between the positive terminal of the one of the two SW elements and the negative terminal of the other of the two SW elements. In the event of failure in one of the two SW elements due to poor manufacturing or heat generation, only the failed element module has to be replaced. Hence, a fabrication yield and a service life of the power conversion device can be improved.

According to a second aspect of the present disclosure, the power conversion device is configured in such a manner that the positive terminal and the negative terminal disposed so as to overlap are in a locational relation such that either one terminal covers the other in the thickness direction. That is to say, the positive terminal and the negative terminal are in a locational relation such that one covers the other when projected onto one plane in the thickness direction of the flat rectangular parallelepiped. In a case where the positive terminal and the negative terminal are of an identical shape, the positive terminal and the negative terminal are in a locational relation such that the both coincide perfectly when projected onto one plane in the thickness direction of the flat rectangular parallelepiped. Hence, the inductance reducing effect obtained by cancelling out magnetic fluxes can be exerted to the maximum extent possible.

According to a third aspect of the present disclosure, the element modules of the two SW elements corresponding to the respective upper and lower arms in the power conversion device are of a same structure. This configuration is preferable not only from the viewpoint of matching the characteristics of the SW elements and reducing the manufacturing costs, but also from the viewpoint of restricting a surge voltage.

According to a fourth aspect of the present disclosure, the positive terminal and the negative terminal are extracted from the lateral surface of each element module of the power conversion device at a same height in the thickness direction. Consequently, a design and attachment becomes easier.

According to a fifth aspect of the present disclosure, in order to enhance the inductance reducing effect obtained by cancelling out magnetic fluxes as described above, the positive terminal and the negative terminal are extracted from one of two regions divided in the thickness direction by a bisector. Owing to the fifth aspect, in a case where the element modules as the upper arm and the lower arm are stacked, the positive terminal and the negative terminal in the locational relation to overlap each other can be disposed in closer proximity to each other in comparison with the element modules from which the corresponding positive terminal and negative terminal are extracted from positions on a bisector (center) in the thickness direction. Hence, the inductance reducing effect obtained by cancelling out magnetic fluxes as described above can be enhanced further. Even in a case where a snubber circuit described below is connected, a current path of the snubber circuit can be shorter. Consequently, inductance Ls of the snubber circuit becomes smaller and hence the surge voltage $\Delta V$ can be restricted.

According to a sixth aspect of the present disclosure, the power conversion device is configured in such a manner that in the other set of the positive electrode forming the P terminal and the negative electrode forming the N terminal, a snubber circuit having a capacitor element can be electrically connected adjacent to the lateral surfaces of the two SW elements between the positive element and the negative electrode.

By connecting the snubber circuit in the power conversion device, the surge voltage $\Delta V$ can be reduced further by letting a capacitor element of the snubber circuit absorb energy accumulated in the inductance Ld of the power supply circuit.

The snubber circuit in the power conversion device is to connect the P and N terminals of the two stacked element modules with a separate member other than the element modules, and is therefore exposed to the outside of the element modules. Hence, heat generated in the snubber circuit can be released satisfactorily in a radiation path different from a radiation path of heat generated in the SW elements via the heat sinks coupled to the positive terminal and the negative terminal extracted to the outside and by means of heat dissipation to air.

According to a seventh aspect of the present disclosure, the snubber circuit in the power conversion device may include a metal member having a current path with substantially a U-shape between the positive terminal and the negative terminal and provided with a cut portion at a midpoint, and a surface-mounted capacitor element, electrodes of which are connected to opposite sides of the cut portion.

According to an eighth aspect of the present disclosure, a resistor is connected to the capacitor element in series in the snubber circuit.

A resistance value Rs of the resistor connected to the capacitor element in series has an appropriate value. When the resistance value Rs is too small, a surge that needs to be reduced cannot be restricted. A current is not consumed by parasitic inductance and the capacitor element in the snubber circuit alone (current is stored in the parasitic inductance) and a resistor that consumes the current becomes necessary. Also, the LC resonance described above occurs readily, which becomes another problem. Conversely, when the resistance value Rs is too large, a surge occurring in the SW elements is not bypassed to the snubber circuit side and the snubber circuit no longer functions.

According to a ninth aspect of the present disclosure, the resistor connected to the capacitor element in series may be formed of a surface-mounted resistor element, and electrodes of the resistor may be connected to opposite sides of a cut portion provided to the metal member of substantially U shape at a position different from the cut portion to which the capacitor element is connected. Alternatively, the resistor may be formed of a trimmed resistor portion, a sectional area of which is reduced at a midpoint of the current path by making an incision to the metal member of substantially a U shape. Further, the resistor may be formed by combining the surface-mounted resistor element and the trimmed resistor portion. When the trimmed resistor portion is used as the resistor, the resistance value Rs can be adjusted after the snubber circuit is attached to the power conversion device.

The snubber circuit in the power conversion device described above is electrically connected collectively between the P terminal of the element module of the upper arm and the N terminal of the element module of the lower arm stacked one on the other. However, a configuration of the snubber circuit is not limited to the configuration described above. For example, according to a tenth aspect of the present disclosure, the snubber circuit may be electrically connected between the positive terminal and the negative terminal individually in each of the stacked element modules of the upper arm and the lower arm. In addition, the snubber circuit in the power conversion device described above is a C snubber circuit having a capacitor alone or an RC snubber circuit having a capacitor element and a resistor. It should be appreciated, however, that a configuration of the snubber circuit is not limited to the configurations as above and the snubber circuit may be an RCD snubber circuit in which a diode is connected to a resistor in parallel.

According to an eleventh aspect of the present disclosure, in order to ensure satisfactory radiation performance of the SW elements as described above, the power conversion device adopts double-sided heat-sinking element modules. Herein, the power conversion device may be configured in such a manner that the element modules of the two SW elements are disposed between water-cooling coolers via an insulating layer. Hence, heat generated in the SW elements (heat generated in the capacitor element and the resistor when the snubber circuit is connected) is transferred to the water-cooling coolers from the heat sinks exposed to the outer surfaces of the respective element modules via the insulating layer. Consequently, a high cooling effect can be exerted.

As has been described, the power conversion device described above is a power conversion device capable of achieving three requirements to restrict a surge voltage, ensure high radiation performance of SW elements, and restrict ringing at the same time. Hence, according to a twelfth aspect of the present disclosure, the power conversion device described above can be employed in a vehicle for which a power conversion device having high power density and a small power loss is required and restriction of a surge voltage becomes a problem when a current, a voltage, and a SW speed of the SW elements are increased.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

A power conversion device of the present disclosure includes two serially-connected SW elements of an upper arm and a lower arm and supplies power to a load from a connection point of the two SW elements by converting a voltage and a current from a DC power supply.

Hereinafter, embodiments of the power conversion device of the present disclosure will be described according to the drawings.

Figure 1A:
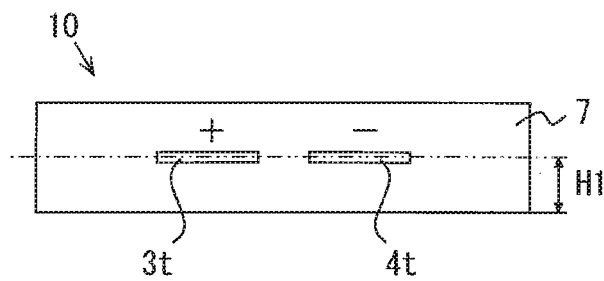
FIG. 1A is a front view of an element module of a SW element used in a power conversion device according to an embodiment of the present disclosure.
Figure 1B:
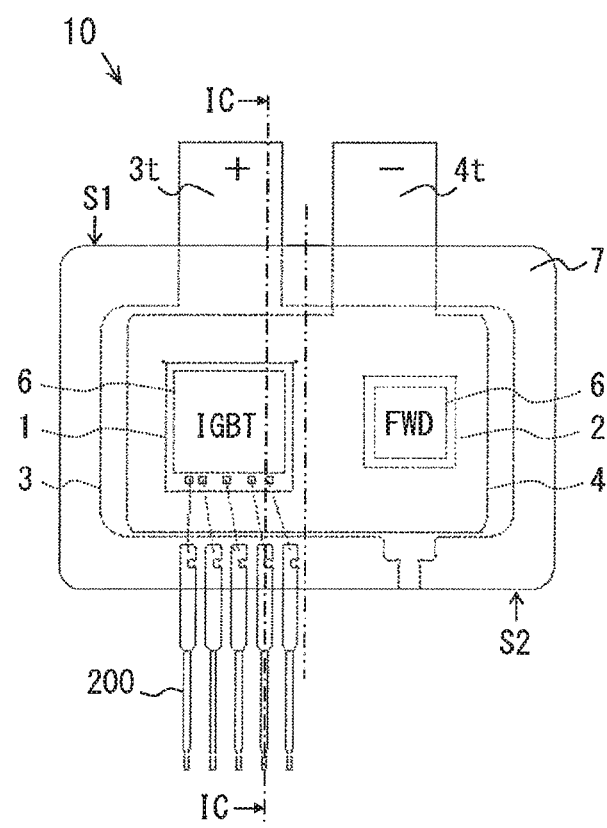
FIG. 1B is a bottom view of the element module shown in FIG. 1A to see through an interior.
Figure 1C:
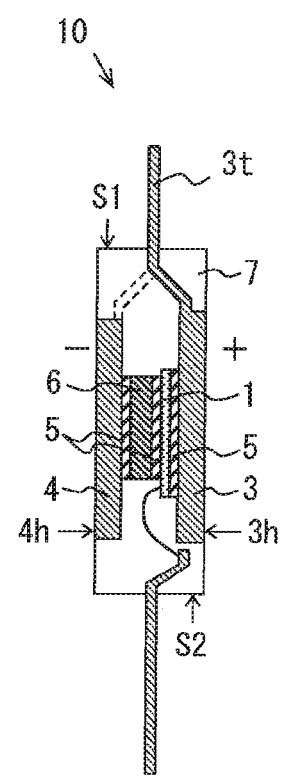
FIG. 1C is a sectional view taken along the alternate long and short dash line IC-IC of FIG. 1B.

FIG. 1A through FIG. 1C are views showing an example of an element module of a SW element used in the power conversion device of the present disclosure. FIG. 1A is a front view of an element module 10. FIG. 1B is a bottom view of the element module 10 to see through an interior. FIG. 1C is a sectional view taken along the alternate long and short dash line IC-IC of FIG. 1B.

Figure 2A:
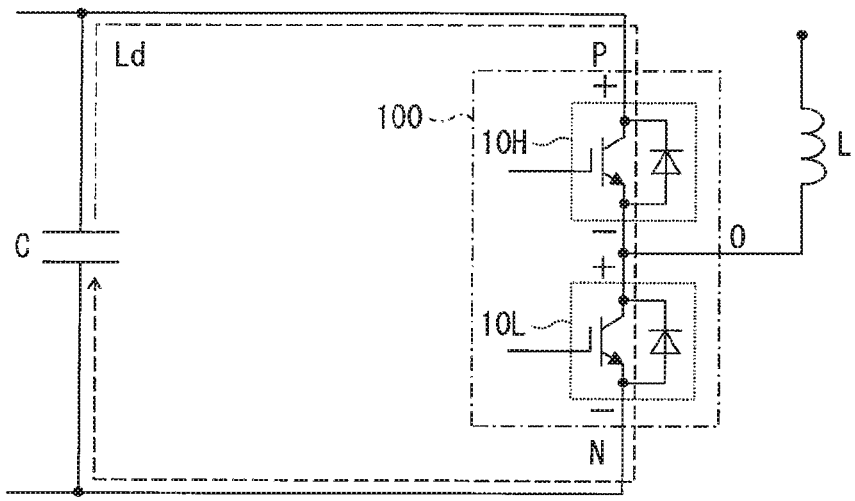
FIG. 2A is a circuit diagram showing an example of a configuration and a usage pattern of the power conversion device according to the embodiment of the present disclosure.
Figure 2B:
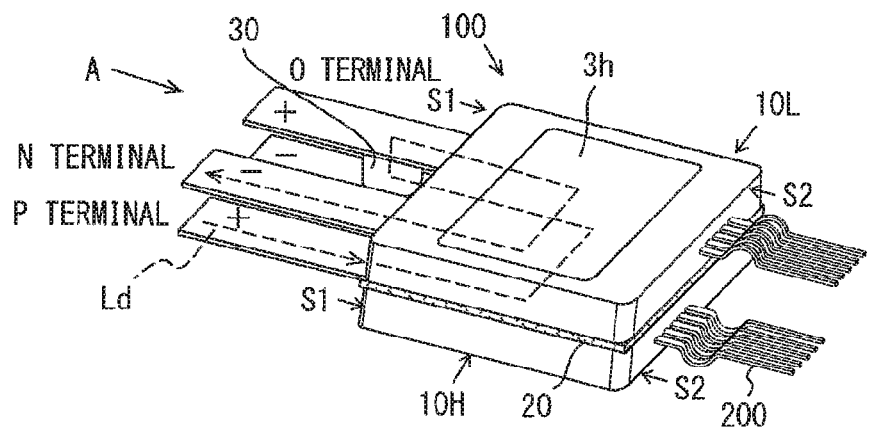
FIG. 2B is a perspective view showing an outward appearance of the power conversion device shown in FIG. 2A.
Figure 2C:
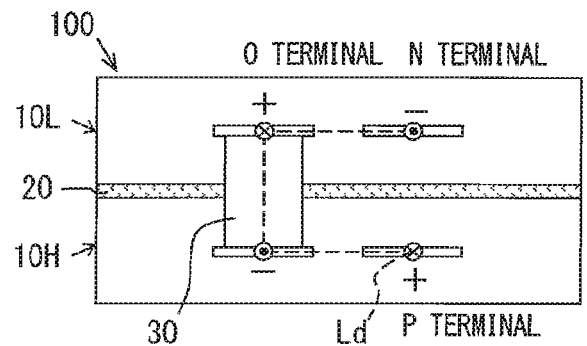
FIG. 2C is a schematic front view of the power conversion device when viewed in a direction indicated by an arrow A of FIG. 2B.

FIG. 2A through FIG. 2C show an example of the power conversion device of the present disclosure using the SW element (element module 10) of FIG. 1A through FIG. 1C. FIG. 2A is a circuit diagram showing an example of a configuration and a usage pattern of a power conversion device 100 encircled by an alternate long and short dash line. FIG. 2B is a perspective view showing an outward appearance of the power conversion device 100. FIG. 2C is a schematic front view when viewed in a direction indicated by an arrow A of FIG. 2B. Portions of FIG. 2A through FIG. 2C same as portions of FIG. 1A through FIG. 1C are labeled with same reference numerals. The power conversion device 100 of FIG. 2A through FIG. 2C is installed to a vehicle, for example, an automobile, and applied as a drive device to drive a motor or the like.

Referring to FIG. 2A, the power conversion device 100 encircled by the alternate long and short dash line includes two serially-connected SW elements (element modules 10H and 10L) of an upper arm and a lower arm. The SW elements shown in the circuit diagram of FIG. 2A are IGBTs (Insulated Gate Bipolar Transistors). A FWD (Flywheel Diode) is connected in anti-parallel with the IGBT. The power conversion device 100 supplies power to a load L from a connection point of the two SW elements of the upper arm and the lower arm by converting a voltage and a current from a DC power supply via a smoothing capacitor C.

The two SW elements of the upper arm and the lower arm forming the power conversion device 100 of FIG. 2A through FIG. 2C are formed, respectively, of element modules 10H and 10L molded with resin in the shape of a flat rectangular parallelepiped, and have the same structure as the element module 10 shown in FIG. 1A through FIG. 1C.

As is shown in FIG. 1B, the element module 10 of FIG. 1A through FIG. 1C includes an IGBT element chip 1 and a FWD element chip 2 made of silicon (Si) and disposed like a plane. Both surfaces of the respective element chips 1 and 2 are sandwiched between a pair of lead frames 3 and 4 functioning as electrodes and heat sinks. The lead frames 3 and 4 are made of a typical lead frame material, a good example of which is a plate of nickel-plated copper alloy.

In the element module 10 of FIG. 1A through FIG. 1C, the IGBT element chip 1 and the FWD element chip 2 may be made, for example, of silicon carbide (SiC). In the element module 10, the IGBT and the FWD are formed of separate element chips 1 and 2, respectively. However, the IGBT and the FWD may be formed of a single element chip.

As is shown in FIG. 1C, the lead frame 3 is bonded to a collector electrode of the IGBT element chip 1 and a cathode electrode of the anti-parallel FWD element chip 2 with solder 5, and functions as a high-potential positive electrode (+). The lead frame 4 is bonded to an emitter electrode of the IGBT element chip 1 and an anode electrode of the anti-parallel FWD element chip 2 with the solder 5 via copper blocks 6 used for height adjustment, and functions as a low-potential negative electrode (−).

In the element module 10 of FIG. 1A through FIG. 1C, a pair of the lead frames 3 and 4, the element chips 1 and 2 disposed between the lead frames 3 and 4, and the copper blocks 6 are encapsulated with mold resin 7. The mold resin 7 is made of a normal mold material, such as epoxy resin, and shaped by transfer molding using a die.

As is shown in FIG. 1C, a part of the lead frame 3 and a part of the lead frame 4 are exposed from the mold resin 7 and function as heat sinks 3h and 4h, respectively. Hence, the element module 10 has a double-sided heat sink configuration by which heat is released from the both surfaces of the respective element chips 1 and 2 via the lead frames 3 and 4. In other words, in the element module 10, the heat sink 3h connected to the positive electrode of the SW element is disposed on one flat surface of the rectangular parallelepiped made of the mold resin 7 and the heat sink 4h connected to the negative electrode is disposed on an opposite flat surface in such a manner that the respective outer surfaces are exposed.

Further, in the element module 10 of FIG. 1A through FIG. 1C, end portions of the lead frames 3 and 4 are extracted from one lateral surface S1 (front surface of FIG. 1A) of the rectangular parallelepiped made of the mold resin 7 as described below and function as terminals 3t and 4t, respectively. That is to say, the positive terminal (+) 3t coupled to the heat sink 3h connected to the positive electrode (+) of the SW element and the negative terminal (−) 4t coupled to the heat sink 4h connected to the negative electrode (−) are extracted from the one lateral surface S1 of the flat rectangular parallelepiped so as not to overlap each other in a thickness direction of the rectangular parallelepiped.

More specifically, in the element module 10, as is indicated by an alternate long and two short dashed line of FIG. 1A, the positive terminal 3t and the negative terminal 4t are extracted from the one lateral surface S1 at a same height H1 in the thickness direction. To be more exact, the alternate long and two short dashed line of FIG. 1A is a bisector of the element module 10 in the thickness direction and therefore the positive terminal 3t and the negative terminal 4t are extracted from the center in the thickness direction.

In the element module 10, as is shown in FIG. 1B, signal lines 200 connected to a control electrode of the SW element (gate electrode of the IGBT element chip 1) are extracted from the other lateral surface S2 opposing the lateral surface S1, from which the positive terminal 3t and the negative terminal 4t are extracted. To be more exact, an alternate long and two short dashed line of FIG. 1B is a bisector of the other lateral surface S2 in a direction orthogonal to the thickness direction and the signal lines 200 are extracted from one of two regions divided by the bisector.

In the power conversion device 100 of FIG. 2A through FIG. 2C, the element modules 10H and 10L, which are two SW elements of the same structure as the element module 10 of FIG. 1A through FIG. 1C described above, are stacked inversely to each other as shown in FIG. 2B. More specifically, in the power conversion device 100, an insulating layer 20 is present between the element modules 10H and 10L to electrically isolate the one from the other, and the element modules 10H and 10L are stacked in the thickness direction in such a manner that the lateral surfaces S1 (front surface shown in FIG. 1A), from each of which the positive terminal (+) and the negative terminal (−) are extracted, are aligned parallel to each other in a same orientation.

Also, as is shown in FIG. 2C, the positive terminal (+) of one SW element and the negative terminal (−) of the other SW element are disposed so as to overlap each other in the thickness direction. In one set of the positive terminal and the negative terminal disposed so as to overlap each other, the positive terminal and the negative terminal are electrically connected by a metal member 30 in the vicinity of the lateral surfaces S1 to form an O terminal (output terminal) connected to the load L. In the other set of the positive terminal and the negative terminal disposed so as to overlap each other, the positive terminal (+) of the SW element as the upper arm forms a P terminal (high-potential terminal) connected to a high potential side of the DC power supply, and the negative terminal (−) of the SW element as the lower arm forms an N terminal (low-potential terminal) connected to a low potential side of the DC power supply.

The power conversion device 100 shown in FIG. 2A through FIG. 2C by way of example supplies power in units of two serially-connected SW elements of the upper arm and the lower arm, and supplies power to the load L from the connection point (O terminal) of the two SW elements. For example, in the case of a power conversion device (inverter) using an in-vehicle-three-phase motor as a load, the power conversion device is formed of serially-connected SW elements in three units corresponding to respective phases U, V and W, and supplies AC power to the three-phase motor as an inductive load from a battery of the DC power supply.

As has been described in SUMMARY OF INVENTION above, a power conversion device employed in a vehicle or the like is required to have high power density and a small power loss in these days, and restriction of a surge voltage and ringing and radiation performance of the SW elements become a problem. Hence, in order to ensure sufficient radiation performance of the SW elements first, the power conversion device 100 of FIG. 2A through FIG. 2C adopts the double-sided heat-sinking element module 10 shown in FIG. 1A through FIG. 1C. That is to say, the two serially-connected SW elements of the upper arm and the lower arm are formed, respectively, of the element modules 10H and 10L each molded with resin in the shape of a flat rectangular parallelepiped. As are shown in FIG. 1A through FIG. 1C, the element modules 10H and 10L have a structure in which the heat sink 3h connected to the positive electrode (+) of the SW element is disposed on one flat surface of the rectangular parallelepiped and the heat sink 4h connected to the negative electrode (−) is disposed on the opposite flat surface in such a manner that the respective outer surfaces are exposed.

By adopting the double-sided heat-sinking element modules 10H and 10L as the SW elements, high radiation performance can be exerted as described below in comparison, for example, with a single-sided heat-sinking element module in which a heat sink is disposed on only one surface of a flat rectangular parallelepiped. Also, the element modules 10H and 10L forming the power conversion device 100 are SW elements of the upper arm and the lower arm, which are separately molded with resin. Hence, the element modules 10H and 10L are compact modules in comparison, for example, with a module in which two SW elements of the upper arm and the lower arm are integrally molded with resin or a module in which three SW elements corresponding to the respective phases U, V, and W of the upper arms are integrally molded with resin. Consequently, when the two element modules 10H and 10L are stacked as in the power conversion device 100, the element modules 10H and 10L can be attached at a high degree of accuracy, and even when a temperature rises due to heat generated in the SW elements, deformation caused by warpage or the like becomes smaller.

The power conversion device 100 shown in FIG. 2A through FIG. 2C by way of example adopts a structure described below for the respective element modules 10H and 10L of the SW elements of the upper arm and the lower arm with the aim of restricting a surge voltage. That is, as are shown in FIG. 1A through FIG. 1C, each of the element modules 10H and 10L has a structure in which the positive terminal (+) coupled to the positive electrode of the SW element and the negative terminal (−) coupled to the negative electrode are extracted from one lateral surface S1 so as not to overlap each other in the thickness direction of the flat rectangular parallelepiped made of the mold resin 7. As are shown in FIG. 2B and FIG. 2C, the element modules 10H and 10L corresponding to the upper arm and the lower arm, respectively, are stacked in the thickness direction via the insulating layer 20 in such a manner that the respective lateral surfaces S1, from which the corresponding positive terminal and negative terminal are extracted, are aligned parallel to each other in the same orientation.

In the stacked state as above, the positive terminal (+) of one SW element and the negative terminal (−) of the other SW element are disposed so as to overlap each other in the thickness direction. That is to say, the positive terminal and the negative terminal are in a locational relation such that the positive terminal and the negative terminal overlap at least partially when projected onto one plane in the thickness direction of the flat rectangular parallelepiped. In one set of the positive terminal and the negative terminal disposed so as to overlap, the positive terminal and the negative terminal are electrically connected in the vicinity of the lateral surfaces S1, from each of which the positive terminal and the negative terminal are extracted, to form the O terminal connected to the load L. In the other set of the positive terminal and the negative terminal disposed so as to overlap, the positive terminal (+) of the SW element of the upper arm forms the P terminal connected to a high potential side of the DC power supply and the negative terminal (−) of the SW element of the lower arm forms the N terminal connected to a low potential side of the DC power supply.

A surge voltage ΔV occurring in the power conversion device 100 of FIG. 2A through FIG. 2C satisfies a relation expressed by Equation (1) as follows:

$$\Delta V = Ld \times (dI/dt) \quad (1)$$

where Ld is inductance of a power-supply circuit indicated by a broken line in FIG. 2A and dI/dt is a current change rate.

An increase in power density (larger current) and a decrease in power loss (faster SW) of the power conversion device described above is in a direction in which the current change rate dI/dt in the right side of Equation (1) above is increased. Hence, in order to restrict the surge voltage ΔV, it is necessary to make the inductance Ld of the power-supply circuit as small as possible.

The locational relation of the two element modules 10H and 10L forming the power conversion device 100 as described above is aimed at restricting the surge voltage ΔV by making the inductance Ld of the power-supply circuit smaller. That is to say, regarding the positive terminal and the negative terminal disposed so as to overlap, as is shown in FIG. 2B, a current flows in an opposite direction at the positive terminal of the SW element of the upper arm forming the P terminal and at the negative terminal of the SW element of the lower arm forming the N terminal. Hence, an effect of reducing inductance by cancelling out magnetic fluxes is exerted. A current flows in an opposite direction also at the negative terminal of the SW element of the upper arm and the positive terminal of the SW terminal of the lower arm until the both are electrically connected to form the O terminal. Hence, the inductance reducing effect obtained by canceling out magnetic fluxes is exerted as well. Owing to the inductance reducing effect as above, the surge voltage ΔV can be restricted by making the inductance Ld of the power-supply circuit smaller in the power conversion device 100 of FIG. 2A through FIG. 2C. Also, magnetic energy stored in the inductance Ld is reduced as the inductance Ld becomes smaller. Hence, resonance with a latent parasitic capacitance component in an Ld path is damped early and a period during which ringing occurs can be shortened, that is, a ringing restricting effect can be obtained.

As has been described, the two element modules 10H and 10L forming the power conversion device are compact modules in which SW elements of the upper arm and the lower arm are molded separately with resin, and can be attached at a high degree of accuracy. Even when a temperature rises due to heat generated in the SW elements, deformation caused by warpage becomes smaller. In particular, deformation of a metal material, such as the electrodes, becomes smaller, too. Hence, the inductance reducing effect obtained by cancelling out magnetic fluxes described above can be exerted in a reliable manner between the positive terminal of one SW element and the negative terminal of the other SW element. In the event of failure in one of the two SW elements due to poor manufacturing or heat generation, only the failed element module has to be replaced. Hence, a fabrication yield and a service life of the power conversion device can be improved.

The power conversion device 100 shown in FIG. 2A through FIG. 2O by way of example will now be described in detail.

In the power conversion device formed by stacking two element modules, it is more preferable that the positive terminal (+) and the negative terminal (−) are in a locational relation such that either one terminal covers the other in the thickness direction. That is to say, the positive terminal and the negative terminal are in the locational relation such that one covers the other when projected onto one plane in the thickness direction of the flat rectangular parallelepiped. The two element modules 10H and 10L in the power conversion device 100 of FIG. 2A through FIG. 2C are of the same structure and the positive terminal and the negative terminal are of an identical shape. Hence, when the two element modules 10H and 10L are stacked, as is shown in FIG. 2C, the positive terminal and the negative terminal are in a locational relation such that the both coincide perfectly when projected onto one plane in the thickness direction of the flat rectangular parallelepiped. Consequently, the inductance reducing effect obtained by cancelling out magnetic fluxes as described above can be exerted to the maximum extent possible.

As has been described, it is preferable that the element modules of the two SW elements corresponding to the respective upper and lower arms in the power conversion device are of the same structure not only from the viewpoint of matching the characteristics of the SW elements and reducing the manufacturing costs, but also from the viewpoint of restricting the surge voltage.

In the element modules 10H and 10L forming the power conversion device 100 of FIG. 2A through FIG. 2C, the signal lines 200 connected to the control electrodes of the SW elements are extracted from the lateral surfaces S2 opposing the lateral surfaces St from which the corresponding positive terminal and negative terminal are extracted. Accordingly, even when the two element modules 10H and 10L are stacked as above, as is shown in FIG. 2B, a direction in which the positive terminals and the negative terminals are extracted and a direction in which the signal lines 200 are extracted are opposite. Consequently, wiring connection to the respective terminals and the signal lines 200 becomes easier.

Further, in the element modules 10H and 10L having the same structure as the element module 10 of FIG. 1A through FIG. 1C, the signal lines 200 are extracted from the lateral surface S2 in one of two regions divided by the bisector in a direction orthogonal to the thickness direction. Accordingly, even when the two element modules 10H and 10L are stacked as described above, as is shown in FIG. 2B, the signal lines of the upper arm and the signal lines of the lower arm can be prevented from overlapping. Consequently, wiring connection to the respective signal lines becomes easier.

A modification of the power conversion device 100 shown in FIG. 2A through 2C will now be described.

Figure 3A:
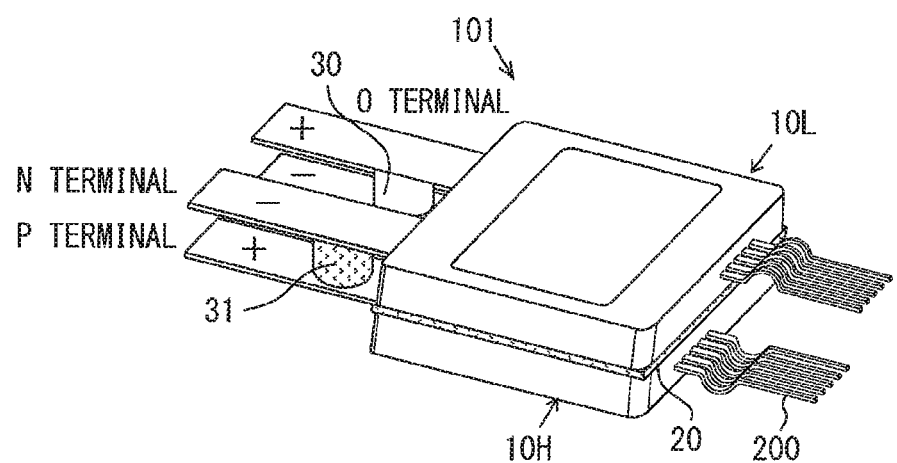
FIG. 3A is a perspective view showing an outward appearance of a modification of the power conversion device.
Figure 3B:
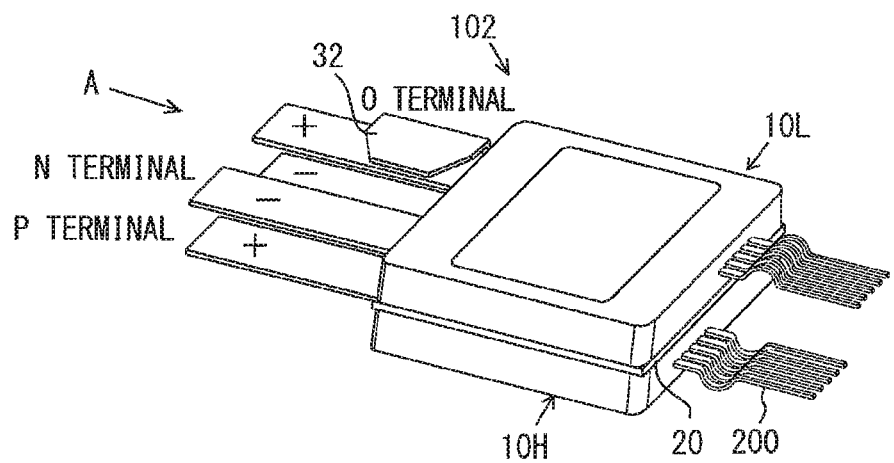
FIG. 3B is a perspective view showing an outward appearance of another modification of the power conversion device.

FIG. 3A and FIG. 3B are perspective views showing outward appearances of power conversion devices 101 and 102, respectively.

In each of the power conversion devices 101 and 102 shown in FIG. 3A and FIG. 3B, respectively, element modules 10H and 10L same as those used in the power conversion device 100 of FIG. 2A through FIG. 2C are used and stacked inversely to each other via the insulating layer 20 in the same manner as in the power conversion device 100.

In the power conversion device 100 of FIG. 2A through FIG. 2C, as is shown in FIG. 2B, the metal member 30 is inserted between the positive terminal and the negative terminal which together form the O terminal, and the positive terminal and the negative terminal are electrically connected in the vicinity of the lateral surfaces S1. The metal member 30 between the positive terminal and the negative terminal not only electrically connects the positive terminal and the negative terminal but also functions as a spacer to fix an interval in the thickness direction.

In the power conversion device 101 shown in FIG. 3A, however, an insulating member 31 functioning as a spacer is also inserted between a set of the positive terminal and the negative terminal forming the P terminal and the N terminal, respectively, in order to fix an interval in the thickness direction between the positive terminal and the negative terminal disposed so as to overlap. Accordingly, the interval between the positive terminals and the negative terminals remains invariable even when an external force or heat is applied. Consequently, the inductance reducing effect obtained by cancelling out magnetic fluxes as described above can be exerted in a stable manner.

In the power conversion device 102 shown in FIG. 3B, the metal member 30 is replaced with a metal member 32 substantially shaped like a capital "U" when viewed in a direction indicated by an arrow A, and the positive terminal and the negative terminal which together form the O terminal are electrically connected from the outside. By ensuring that the metal member 32 has a predetermined thickness, the metal member 32 also becomes capable of functioning as a spacer to fix an interval in the thickness direction between the positive terminal and the negative terminal.

Figure 4A:
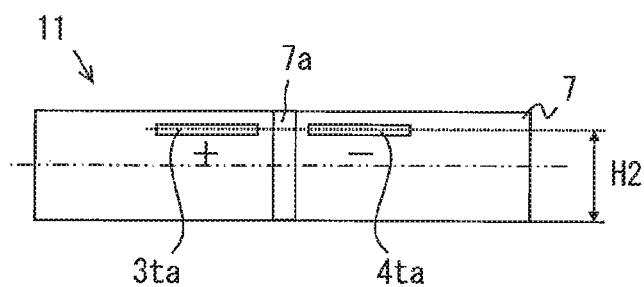
FIG. 4A is a front view showing an example of another element module.
Figure 4B:
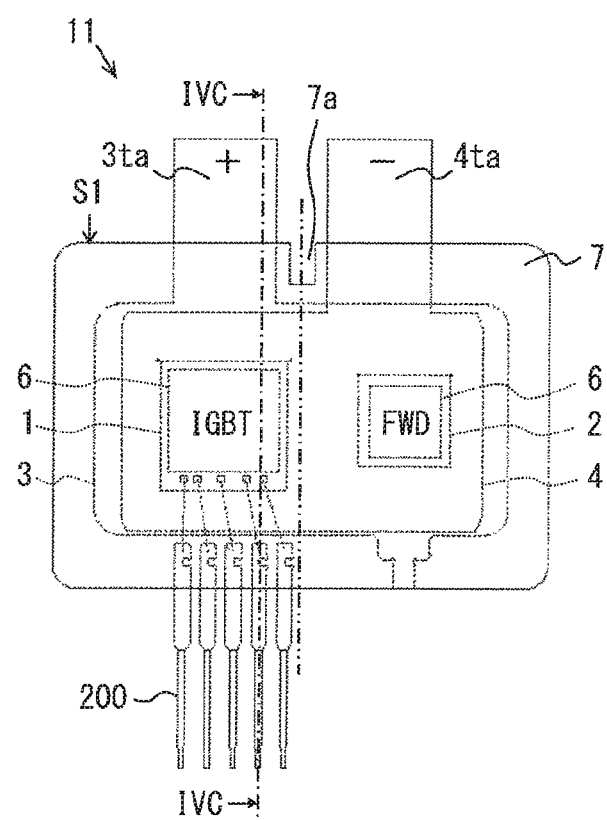
FIG. 4B is a bottom view of the element module shown in FIG. 4A to see through an interior.
Figure 4C:
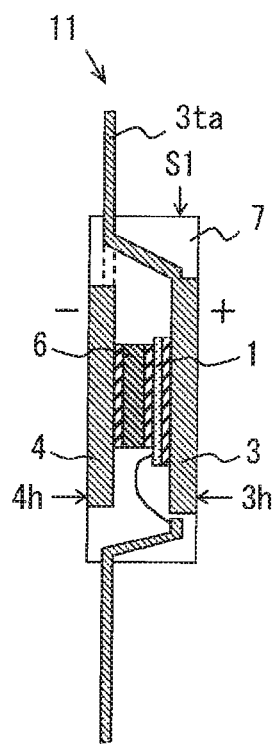
FIG. 4C is a sectional view taken along the alternate long and short dash line IVC-IVC of FIG. 4B.

FIG. 4A through FIG. 4C are views showing an example of another element module of SW elements used in the power conversion device of the present disclosure. FIG. 4A is a front view of an element module 11 and FIG. 4B is a bottom view of the element module 11 to see through an interior. FIG. 4C is a sectional view taken along the alternate long and short dash line IVC-IVC of FIG. 4B. Portions of the element module 11 of FIG. 4A through FIG. 4C same as the portions of the element module 11 of FIG. 1A through FIG. 1C are labeled with same reference numerals.

Figure 5:
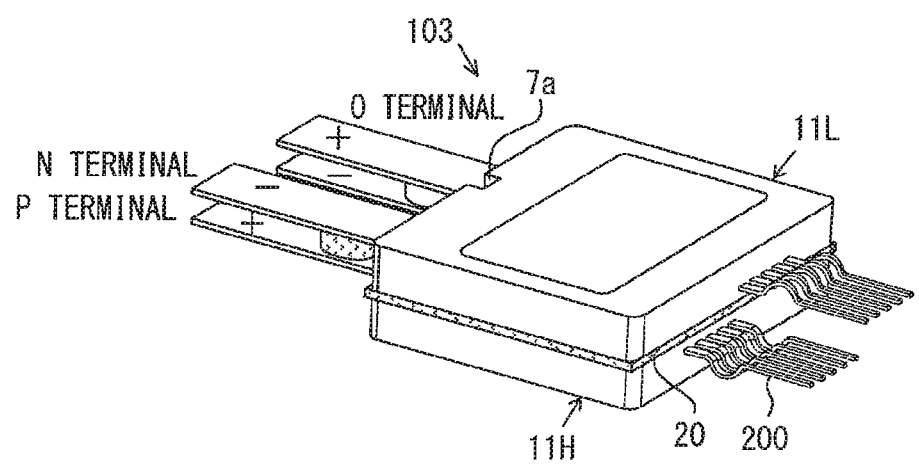
FIG. 5 is a perspective view showing an outward appearance of a power conversion device using the element module of FIG. 4A through FIG. 4C.

FIG. 5 is a perspective view showing an outward appearance of a power conversion device 103, which is an example of the power conversion device of the present disclosure using the SW element (element module 11) of FIG. 4A through FIG. 4C. In the power conversion device 103 of FIG. 5, element modules 11H and 11L of two SW elements as an upper arm and a lower arm of the same structure as the element module 11 of FIG. 4A through FIG. 4C are stacked inversely to each other via an insulating layer 20.

A difference of the element module 11 of the SW element shown in FIG. 4A through FIG. 4C from the element module 10 of the SW element shown in FIG. 1A through FIG. 1C is a height H2 of a positive terminal (+) 3ta and a negative terminal (−) 4ta extracted from a lateral surface S1 of a rectangular parallelepiped made of mold resin 7.

In the element module 10 of FIG. 1A through FIG. 1C, the positive terminal 3t and the negative terminal 4t are at the same height H1 in the thickness direction, and extracted from positions on a bisector in the thickness direction of the element module 10 indicated by the alternate long and two short dashes line, that is, from the center in the thickness direction. On the contrary, in the element module 11 of FIG. 4A through FIG. 4C, the positive terminal 3ta and the negative terminal 4ta are extracted from the same height H2 in the thickness direction in an upper region of two regions divided in the thickness direction by the bisector indicated by an alternate long and two short dashes line of FIG. 4A.

Owing to the configuration as above, in the power conversion device 103 of FIG. 5 in which the element modules 11H and 11L of the same structure as the structure of FIG. 4A through FIG. 4C are stacked inversely to each other, the positive terminal (+) and the negative terminal (−) in the locational relation to overlap each other can be disposed in closer proximity to each other in comparison with the power conversion device 100 of FIG. 2A through FIG. 2C. Hence, the inductance reducing effect obtained by cancelling out magnetic fluxes described above with the power conversion device 100 of FIG. 2A through FIG. 2C, which is exerted by letting a current flow in an opposite direction, can be enhanced further. Even in a case where a snubber circuit described below is connected, a current path of the snubber circuit can be shorter. Consequently, inductance Ls of the snubber circuit becomes smaller and hence the surge voltage ΔV can be restricted.

The element module 11 of FIG. 4A through FIG. 4C is different from the element module 10 of FIG. 1A through FIG. 1C in that a groove 7a running through the lateral surface S1 of the rectangular parallelepiped made of the mold resin 7 in the thickness direction is provided between the positive terminal (+) and the negative terminal (−). The inductance Ld becomes larger when the positive terminal 3ta and the negative terminal 4ta are apart. However, by providing the groove 7a, a creeping discharge, which readily occurs between the positive terminal and the negative terminal when a space between the two terminals is narrowed, can be avoided.

Figure 6A:
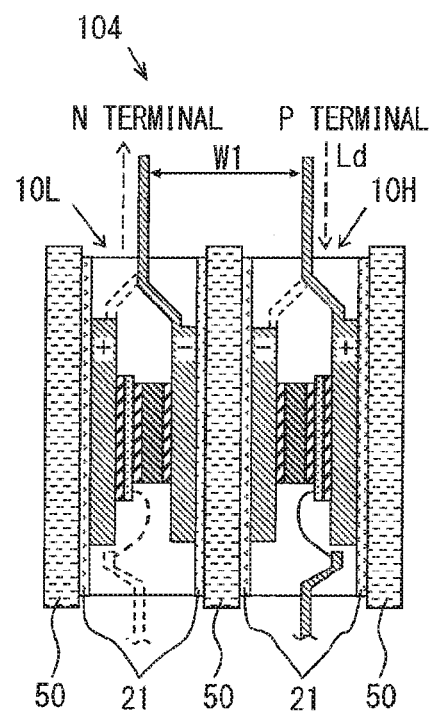
FIG. 6A is a sectional view of a power conversion device showing another example of the configuration of the power conversion device using the element module shown in FIG. 1A through FIG. 1C.
Figure 6B:
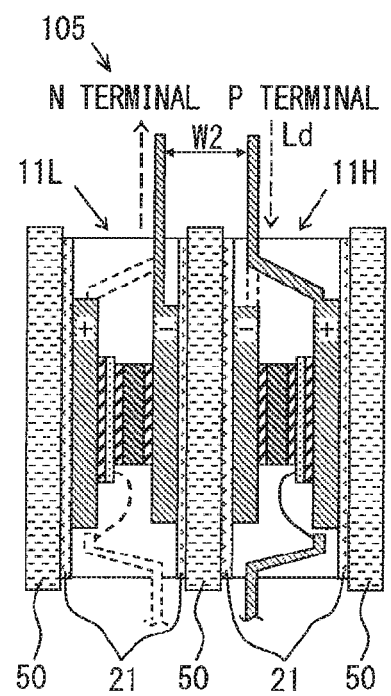
FIG. 6B is a sectional view of a power conversion device showing another example of the configuration of the power conversion device using the element module shown in FIG. 4A through FIG. 4C.

FIG. 6A and FIG. 6B are sectional views of power converter devices 104 and 105, respectively. FIG. 6A shows another example of the configuration of the power conversion device using the element module 10 of FIG. 1A through FIG. 1C and FIG. 6B shows another example of the configuration of the power conversion device using the element module 11 of FIG. 4A through FIG. 4C.

In the power conversion device 104 of FIG. 6A, elements modules 10H and 10L as the upper arm and the lower arm of the same structure as the element module 10 shown in FIG. 1A through FIG. 10 are stacked inversely in the same manner as in the power conversion device 100 of FIG. 2A through FIG. 20. In the power conversion device 105 of FIG. 6B, element modules 11H and 11L of the upper arm and the lower arm of the same structure as the element module 11 shown in FIG. 4A through FIG. 4C are stacked inversely in the same manner as in the power conversion device 103 of FIG. 5.

As has been described above, the element module 10 shown in FIG. 1A through FIG. 1C and the element module 11 shown in FIG. 4A through FIG. 4C are double-sided heat-sinking element modules each having the heat sinks 3h and 4h disposed, respectively, on one and opposite flat surfaces of the rectangular parallelepiped made of the mold resin 7. The power conversion device 104 and 105 shown in FIG. 6A and FIG. 6B, respectively, are therefore configured in such a manner that the element modules 10H and 10L are disposed and the element modules 11H and 11L are disposed between water-cooling coolers 50 via insulating layers 21. Hence, heat generated in the SW elements (heat generated in a capacitor element and a resistor when the snubber circuit described below is connected) is transferred to the water-cooling coolers 50 from the heat sinks 3h and 4h exposed to the outer surfaces of each element module via the insulating layers 21. Consequently, the power conversion devices 104 and 105 shown in FIG. 6A and FIG. 6B, respectively, become capable of exerting a high cooling effect and hence ensuring sufficient radiation performance of the SW elements.

The insulating layers 21 can adopt, for example, a configuration as follows. That is, a triple-layer insulating layer made up of a layer of thermal grease, a layer of a ceramic substrate ($Si_3N_4$, AlN, $Al_2O_3$, or the like), and another layer of thermal grease is interposed between the heat sink and the water-cooling cooler. Alternatively, a heat-sinking and insulating sheet (for example, epoxy-based resin mixed with inorganic filler, such as $Al_2O_3$, BN, and AlN, so as to have high thermal conductivity) may be interposed between the heat sink and the water-cooling cooler.

As are indicated by intervals W1 and W2 of FIG. 6A and FIG. 6B, respectively, the positive terminal (+) and the negative terminal (−) in the locational relation to overlap each other can be in closer proximity to each other in the power conversion device 105 of FIG. 6B than in the power conversion device 104 of FIG. 6A. Hence, because the inductance reducing effect obtained by cancelling out magnetic fluxes can be enhanced further, the configuration of the power conversion device 105 of FIG. 6B is more preferable than the configuration of the power conversion device 104 of FIG. 6A.

In the power conversion devices described above, a snubber circuit can be electrically connected between the positive terminal and the negative terminal forming the P terminal and the N terminal, respectively, in order to further reduce the surge voltage ΔV in addition to the inductance reducing effect obtained by cancelling out magnetic fluxes.

Figure 7A:
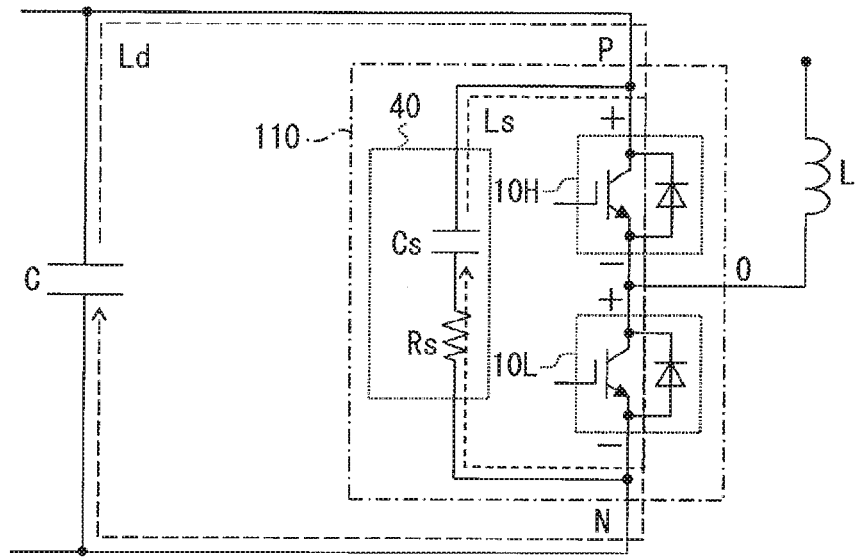
FIG. 7A is a circuit diagram showing an example of a configuration and a usage pattern of a power conversion device additionally provided with a snubber circuit.
Figure 7B:
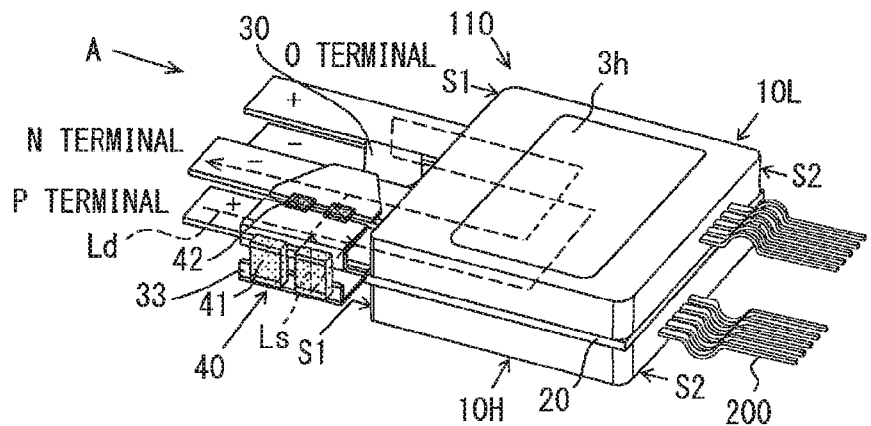
FIG. 7B is a perspective view showing an outward appearance of the power conversion device shown in FIG. 7A.
Figure 7C:
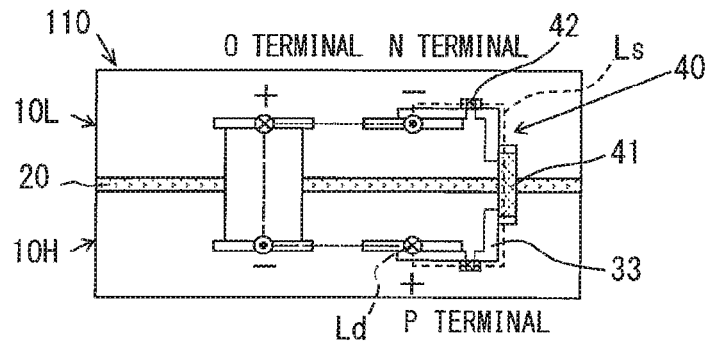
FIG. 7C is a schematic front view of the power conversion device when viewed in a direction indicated by an arrow A of FIG. 7B.

FIG. 7A through FIG. 7C show an example of a power conversion device which is the power conversion device 100 shown in FIG. 2A through FIG. 2C additionally provided with a snubber circuit. FIG. 7A is a circuit diagram showing an example of a configuration and a usage pattern of a power conversion device 110 encircled by an alternate long and short dash line. FIG. 7B is a perspective view showing an outward appearance of the power conversion device 110. FIG. 7C is a schematic front view when viewed in a direction indicated by an arrow A of FIG. 7B. Portions of the power conversion device 110 of FIG. 7A through FIG. 7C same as the portions of the power conversion device 100 of FIG. 2A through FIG. 2C are labeled with same reference numerals.

As with the power conversion device 100 shown in the circuit diagram of FIG. 2A, the power conversion device 110 encircled by the alternate long and short dash line in the circuit diagram of FIG. 7A includes two serially-connected SW elements (element modules 10H and 10L) of an upper arm and a lower arm. The power conversion device 110 supplies power to a load L from a connection point of the two SW elements of the upper arm and the lower arm by converting a voltage and a current from a DC power supply via a smoothing capacitor C. Meanwhile, in addition to the circuit configuration of the power conversion device 100 of FIG. 2A, a snubber circuit 40, which is made up of a capacitor Cs and a resistor Rs connected in series, is connected next to lateral surfaces S1 between a P terminal and an N terminal in the power conversion device 110 of FIG. 7A.

In the power conversion device 110 of an actual configuration shown in FIG. 7B and FIG. 7C, the snubber circuit 40 of an actual configuration as described below is additionally provided between the positive terminal (+) and the negative terminal (−) forming the P terminal and the N terminal, respectively, in the power conversion device 100 of FIG. 2B and FIG. 2C. That is to say, the snubber circuit 40 in the power conversion device 110 of FIG. 7A through FIG. 7C includes a metal member 33 substantially shaped like a capital "U" when viewed in a direction indicated by an arrow A of FIG. 7B and provided with cut portions at midpoints, and surface-mounted capacitor elements 41 and resistor elements 42, electrodes of which are connected to opposite sides of the cut portions. The snubber circuit 40 configured as shown in the drawings are electrically connected between the positive terminal and the negative terminal forming the P terminal and the N terminal, respectively, in the vicinity of the lateral surfaces S1. In order to connect the snubber circuit 40, the snubber circuit 40 may be fastened with screws as described below, or joined by brazing (soldering) or welding.

The snubber circuit 40 in the power conversion device 110 shown in FIG. 7B and FIG. 7C is to connect the P and N terminals of the two stacked element modules 10H and 10L with a separate member other than the element modules, and is therefore exposed to the outside of the element modules. Hence, heat generated in the snubber circuit 40 can be released satisfactorily in a radiation path different from a radiation path of heat generated in the SW elements via the heat sinks coupled to the positive terminal and the negative terminal extracted to the outside and by means of heat dissipation to air.

The snubber circuit 40 in the power conversion device 110 shown in FIG. 7A is an RC snubber circuit in which the resistor Rs is connected to the capacitor Cs in series. It should be appreciated, however, that the snubber circuit 40 is not limited to the RC snubber circuit, and a certain reducing effect of the surge voltage ΔV can be obtained even when the snubber circuit 40 is a C snubber circuit having the capacitor Cs alone. Alternatively, the snubber circuit 40 may be an RCD snubber circuit in which a diode is connected to the resistor Rs in parallel.

In the circuit configuration of the power conversion device 110 shown in FIG. 7A, a reducing effect of the surge voltage ΔV obtained by the capacitor Cs of the snubber circuit 40 alone will be described first.

By connecting the snubber circuit as above to the power conversion device, the surge voltage ΔV expressed by Equation (1) above can be reduced as described below by letting the capacitor element of the snubber circuit absorb energy accumulated in the inductance Ld of the power-supply circuit.

In the power conversion device additionally provided with the snubber circuit, the surge voltage ΔV occurring in the power conversion device has a relation expressed by Equation (2) as follows:

$$\Delta V = I \times \sqrt{(Ld/Cs)} + Ls \times (dI/dt) \qquad (2)$$

where Ls is inductance of the snubber circuit and Cs is a capacitance value of the capacitor element of the snubber circuit as shown in FIG. 7A.

The surge voltage ΔV when the snubber circuit is connected as expressed by Equation (2) above can be restricted to a sufficiently small value in comparison with the surge voltage ΔV when the snubber circuit is not connected as expressed by Equation (1) above. That is to say, in Equation (2) above, the first term in the right side relating to the inductance Ld of the power-supply circuit is a term inside the square root. Hence, by using a capacitor element having a predetermined capacitance value, the first term in the right side can be made smaller than the second term in the right side relating to the inductance Ls of the snubber circuit. Also, as is shown in FIG. 7B, the wiring (loop) has a short length. Hence, the inductance Ls of the snubber circuit has a sufficiently small value in comparison with the inductance Ld of the power-supply circuit. The second term in the right side of Equation (2) above therefore takes a value sufficiently smaller than the value of the right side of the Equation (1) above.

More specifically, in the power conversion device described above, regarding the positive terminal and the negative terminal disposed so as to overlap, a current flows in an opposite direction at the positive terminal of the upper arm forming the P terminal and the negative terminal of the lower arm forming the N terminal, and therefore the reducing effect of the inductance Ld obtained by cancelling out magnetic fluxes as described above is exerted. Accordingly, the first term in the right side of Equation (2) above can be made smaller than the second term using a capacitor element having a relatively small capacitance value Cs. Also, in the power conversion device described above, the positive terminal of the upper arm forming the P terminal and the negative terminal of the lower arm forming the N terminal are disposed so as to overlap. Hence, the snubber circuit connected between the positive terminal and the negative terminal can be formed with the shortest wiring length. Consequently, the inductance Ls of the snubber circuit, which is the second term in the right side of Equation (2) above, can be also reduced to a minimum and an effect obtained by connecting the snubber circuit can be exerted to the maximum extent possible.

In the circuit configuration of the power conversion device 110 shown in FIG. 7A, an effect obtained by connecting the resistor Rs to the capacitor Cs in series in the snubber circuit 40 will now be described.

In the power conversion device 110 shown in FIG. 7A, in a case where the resistor is not connected to the capacitor Cs in series in the snubber circuit 40, LC resonance occurs between the inductance Ld of the power-supply circuit and the capacitor element Cd in the snubber circuit 40 and ringing becomes larger. Let Rs be a resistance value of the resistor connected to the capacitor element in series, then an attenuation coefficient ζ of the LC resonance is expressed by Equation (3) as follows:

$$\zeta = (Rs/2) \times \sqrt{(Cs/Ld)} \qquad (3).$$

In a case where the resistor is not connected to the capacitor element in series in the snubber circuit 40, Rs=0 is given to the right side of Equation (3) above. Hence, the attenuation coefficient ζ=0 is obtained (attenuation does not occur).

The resistance value Rs of the resistor connected to the capacitor element in series has an appropriate value. When the resistance value Rs is too small, a surge that needs to be reduced cannot be restricted much. A current is not consumed by parasitic inductance and the capacitor element in the snubber circuit alone (current is stored in the parasitic inductance) and a resistor that consumes the current becomes necessary. Also, when the resistance value Rs is too small, the LC resonance readily occurs, which becomes another problem. Conversely, when the resistance value Rs is too large, a surge occurring in the SW elements is not bypassed to the snubber circuit side and the snubber circuit no longer functions.

As has been described, a trade-off relation is generated depending on whether the resistor connected to the capacitor element in series has a large or small resistance value Rs.

Hence, a preferable value of the attenuation coefficient ξ of Equation (3) above is about 0.5, with which resonance occurs only slightly. By designing the snubber circuit when the attenuation coefficient ζ=0.5 is given, Cs and Rs can be determined in accordance, respectively, with Equations (4) and (5) as below by using, for example, an increase of the voltage (the first term in the right side of Equation (2) above), δ V, via the snubber circuit.

$$Cs = Ld \times (I/\delta V)^2 \quad (4)$$

$$Rs = \sqrt{(Ld/Cs)} \quad (5)$$

The power conversion device 110 of FIG. 7A through FIG. 7C, to which the snubber circuit 40 including the capacitor Cs having an appropriate capacitance value and the resistor Rs having an appropriate resistance value and connected to the capacitor Cs in series is connected, is thus capable of restricting the surge voltage ΔV and the ringing more effectively than the power conversion device 100 of FIG. 2A through FIG. 2C.

A modification of the power conversion device 110 shown in FIG. 7A through FIG. 7C will now be described.

Figure 8A:
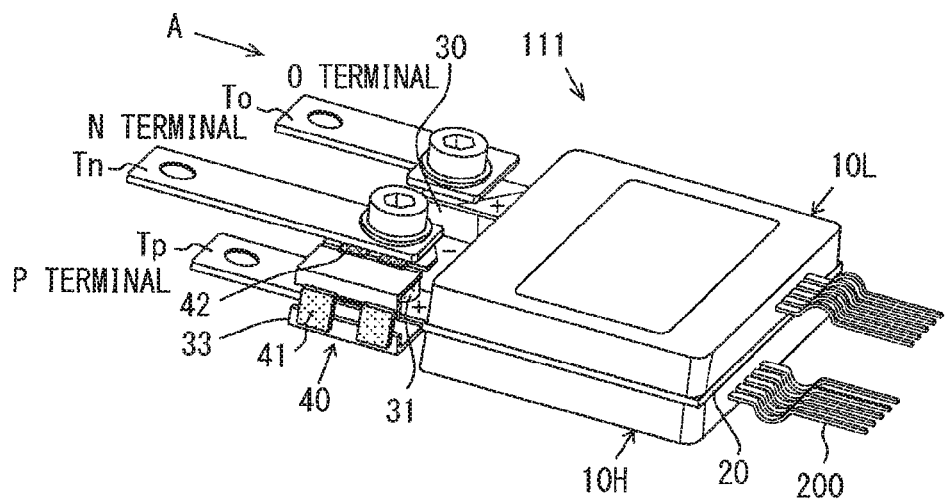
FIG. 8A is a perspective view showing an outward appearance of still another example of the power conversion device.
Figure 8B:
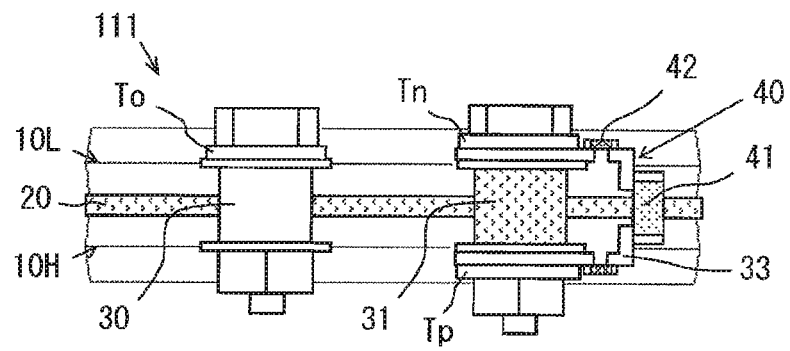
FIG. 8B is a front view of the power conversion device shown in FIG. 8A when viewed in a direction indicated by an arrow A.
Figure 8C:
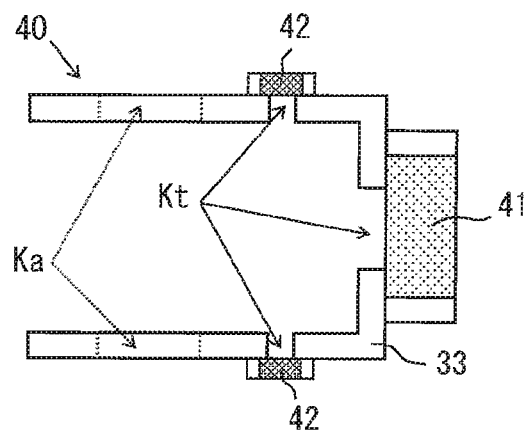
FIG. 8C is an enlarged view of the snubber circuit in the power conversion device shown in FIG. 8B.

FIG. 8A through FIG. 8C show still another example of the power conversion device. FIG. 8A is a perspective view showing an outward appearance of a power conversion device 111. FIG. 8B is a front view when viewed in a direction indicated by an arrow A of FIG. 8A. FIG. 8C is an enlarged view of a snubber circuit 40 shown in FIG. 8B.

In the power conversion device 111 shown in FIG. 8A through FIG. 8C, the snubber circuit 40 same as the snubber circuit 40 used in the power conversion device 110 of FIG. 7A through FIG. 7C is connected between a P terminal and an N terminal where the insulting member 31 functioning as the spacer in the power conversion device 101 shown in FIG. 3A is inserted. In the power conversion device 111 shown in FIG. 8A and FIG. 8B, a P terminal Tp, an N terminal Tn, and an O terminal To, which are connected to a predetermined positive terminal (+) and a predetermined negative terminal (−) with screws, are shown. In a metal member 33 substantially shaped like a capital U of the snubber circuit 40 shown in FIG. 8C, screw through-holes Ka indicated by a dotted line, cut portions Kt connected to electrodes of a capacitor element 41 and resistor elements 42 on both sides are shown.

Figure 9A:
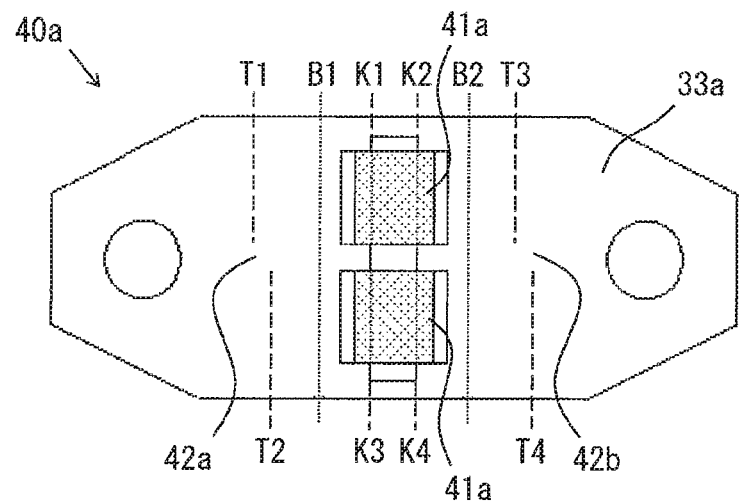
FIG. 9A is a top view showing another example of an actual configuration of the snubber circuit in the middle of fabrication.
Figure 9B:
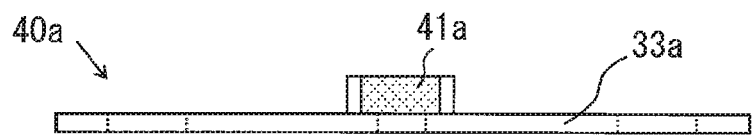
FIG. 9B is a front view of the snubber circuit shown in FIG. 9A.
Figure 9C:
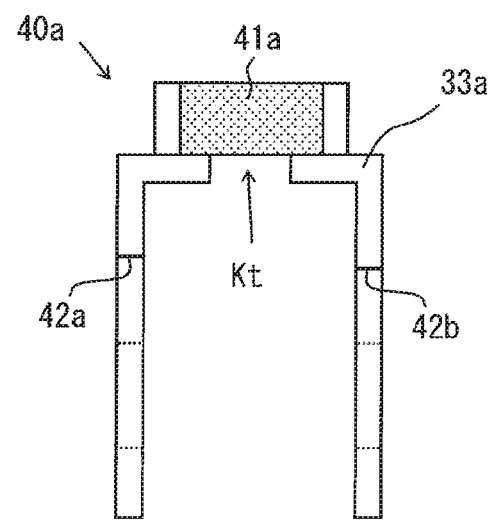
FIG. 9C is an enlarged front view of the completed snubber circuit shown in FIG. 9B.
Figure 10A:
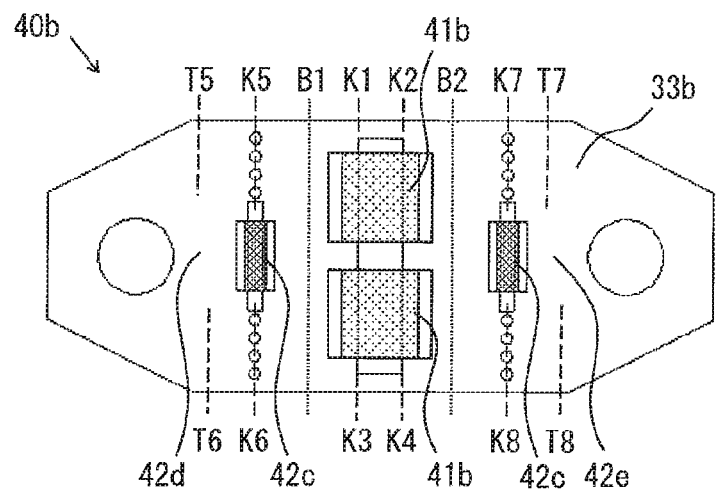
FIG. 10A is a top view showing still another example of the actual configuration of the snubber circuit during fabrication.
Figure 10B:
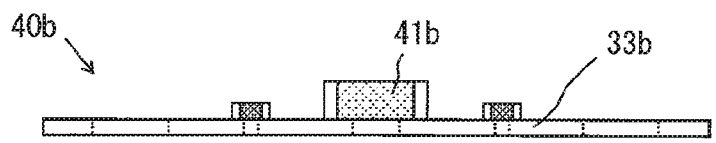
FIG. 10B is a front view of the snubber circuit shown in FIG. 10A.
Figure 10C:
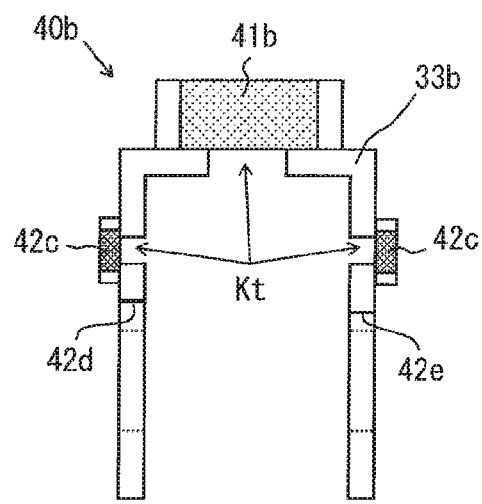
FIG. 10C is an enlarged front view of the completed snubber circuit shown in FIG. 10B.

FIG. 9A through FIG. 9C and FIG. 10A through FIG. 10C are views showing other examples of the actual configuration of the snubber circuit. FIG. 9A and FIG. 9B show a snubber circuit 40a in the middle of fabrication and FIG. 10A and FIG. 10B show a snubber circuit 40b also in the middle of fabrication. FIG. 9A and FIG. 10A are top views and FIG. 9B and FIG. 10B are front views. FIG. 9C and FIG. 10C are enlarged front views showing the completed snubber circuits 40a and 40b, respectively.

In the examples of the actual configuration of the snubber circuit 40 shown in FIG. 7A through FIG. 7C and in FIG. 8A through FIG. 8C, the surface-mounted resistor elements 42 are used as the resistor Rs in the circuit diagram of FIG. 7A.

On the contrary, in the snubber circuit 40a of FIG. 9A through FIG. 9C, resistor portions 42a and 42b are used as the resistor Rs in the circuit diagram of FIG. 7A. The resistor portions 42a and 42b are trimmed resistor portions, sectional areas of which are reduced at a midpoint of a current path by making incisions to a metal member 33a substantially shaped like a capital "U".

The snubber circuit 40a shown in FIG. 9A and FIG. 9B is in a state in which two surface-mounted capacitor elements 41a are mounted on the plate-like metal member 33a before bending and cutting are applied. Each of dotted lines B1 and B2 of FIG. 9A indicates a position at which bending is applied. The metal member 33a substantially shaped like a capital "U" shown in FIG. 9C is formed by bending the metal member 33a at a right angle toward the back of the sheet surface along the dotted lines B1 and B2. Also, broken lines K1 through K4 and T1 through T4 of FIG. 9A are lines each indicating a position at which an incision is made and a length of the incision. The lower cut portion Kt of the capacitor element 41a shown in FIG. 9C is formed by cutting into the metal member 33a along the broken lines K1 through K4 of FIG. 9A. Also, the trimmed resistor portions 42a and 42b, the sectional areas of which are reduced at a midpoint in the current path, are formed by cutting into the metal member 33a along the broken lines T1 through T4 of FIG. 9A.

The cutting along the broken lines K1 through K4 and T1 through T4 is applied by laser processing after the metal member 33a is bent along the dotted lines B1 and B2 and the snubber circuit 40a is attached between the positive terminal (+) and the negative terminal (−) of the stacked element modules 10H and 10L. Hence, the resistor Rs of the trimmed resistor portions 42a and 42b can be adjusted as needed in post-processing. Most of a SW loss in the snubber circuit is consumed (heat generation) at the resistor and breaking is concerned for a resistor formed of a thin film. However, because a thick lead frame is used in the configuration of the trimmed resistor portions 42a and 42b, no concern on breaking is raised.

In the snubber circuit 40b of FIG. 10A through FIG. 10C, both of surface-mounted resistor elements 42c and trimmed resistor portions 42d and 42e are used as the resistor Rs in the circuit diagram of FIG. 7A.

The snubber circuit 40b shown in FIG. 10A and FIG. 10B is in a state in which two surface-mounted capacitor elements 41b and two surface-mounted resistor elements 42c are mounted on a plate-like metal member 33b. Cut portions Kt shown in FIG. 10C are provided under the capacitor element 41b and under the resistor elements 42c at different positions by cutting into the metal member 33b along broken lines K1 through K8 of FIG. 10A. Also, the trimmed resistor portions 42d and 42e, the sectional areas of which are reduced at a midpoint in a current path, are provided by cutting into the metal member 33b along broken lines T5 through T8 of FIG. 10A.

As are shown above by the actual configurations of the snubber circuits 40, 40a, and 40b by way of example, the resistor Rs of FIG. 7A connected to the capacitor element in series may be either a surface-mounted resistor element or trimmed resistor portions, the sectional areas of which are reduced at a midpoint in the current path. Alternatively, a surface-mounted resistor element and trimmed resistor portions may be combined. In a case where the trimmed resistor portions are used as the resistor, the resistance value Rs can be adjusted after the snubber circuit is attached between the predetermined terminals in the power conversion device. In order to set the attenuation coefficient ζ to 0.5 (ζ=0.5) in Equation (3) above, it is particularly crucial to set the resistance value Rs with accuracy because the capacitance value Cs contributes to a computation inside the square root whereas the resistance value Rs contributes to a computation outside the square root. Accordingly, it is preferable that the resistance value Rs can be adjusted by providing trimmed resistor portions after the snubber circuit is attached.

It is also preferable that the surface-mounted capacitor elements and resistor elements used in the snubber circuits 40, 40a and 40b have a small parasitic inductance component. It is therefore preferable to use the surface-mounted capacitor elements and resistor elements having a short length in a direction of the current path (having a small L to W ratio). Further, from the thermal viewpoint, it is preferable to apply a configuration to divide a required resistance value Rs, for example, to (Rs/n)×n (in serial connection) and apply a configuration to divide a required capacitance value Cs, for example, to (Cs/n)×n (in parallel connection).

Figure 11A:
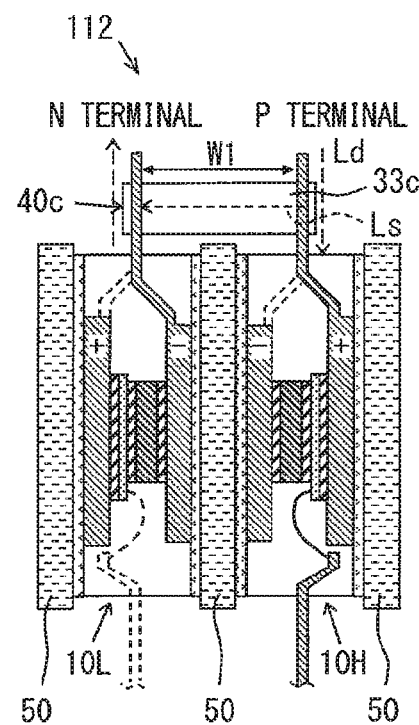
FIG. 11A is a schematic view of a power conversion device, which is the power conversion device shown in FIG. 6A provided with the snubber circuit.
Figure 11B:
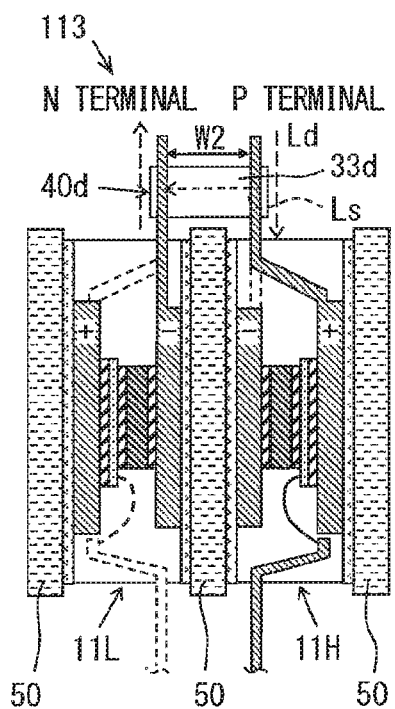
FIG. 11B is a schematic view of a power conversion device, which is the power conversion device shown in FIG. 6B provided with the snubber circuit.

FIG. 11A and FIG. 11B are schematic views of power conversion devices 112 and 113, respectively. In the power conversion device 112, a snubber circuit 40c is attached to the power conversion device 104 shown in FIG. 6A. In the power conversion device 113, a snubber circuit 40d is attached to the power conversion device 105 shown in FIG. 6B. In FIG. 11A and FIG. 11B, capacitors and resistors making up the snubber circuits 40c and 40d are omitted for ease of illustration and only metal members 33c and 33d in a current path are schematically shown.

In the power conversion device 113 of FIG. 11B, as are indicated by intervals W1 and W2, a positive terminal (+) and a negative terminal (−) in a locational relation to overlap each other can be in closer proximity to each other than in the power conversion device 112 of FIG. 11A as in the power conversion devices 104 and 105 of FIG. 6A and FIG. 6B, respectively. Hence, the metal member 33d forming the snubber circuit 40d in the power conversion device 113 of FIG. 11B can be shorter in comparison with the metal member 33c forming the snubber circuit 40c in the power conversion device 112 of FIG. 11A. Consequently, not only can the inductance reducing effect obtained by cancelling out magnetic fluxes described as above be better, but also the parasitic inductance Ls of the snubber circuit can be smaller in the power conversion device 113 of FIG. 11B than in the power conversion device 112 of FIG. 11A. The power conversion devices 112 and 113 of FIG. 11A and FIG. 11B, respectively, are not only capable of releasing heat generated in the snubber circuit 40c and 40d to outside air, but also capable of releasing the heat to the water-cooling coolers 50 via the heat sinks exposed to the outer surfaces of the element modules and the insulating layers.

Figure 12:
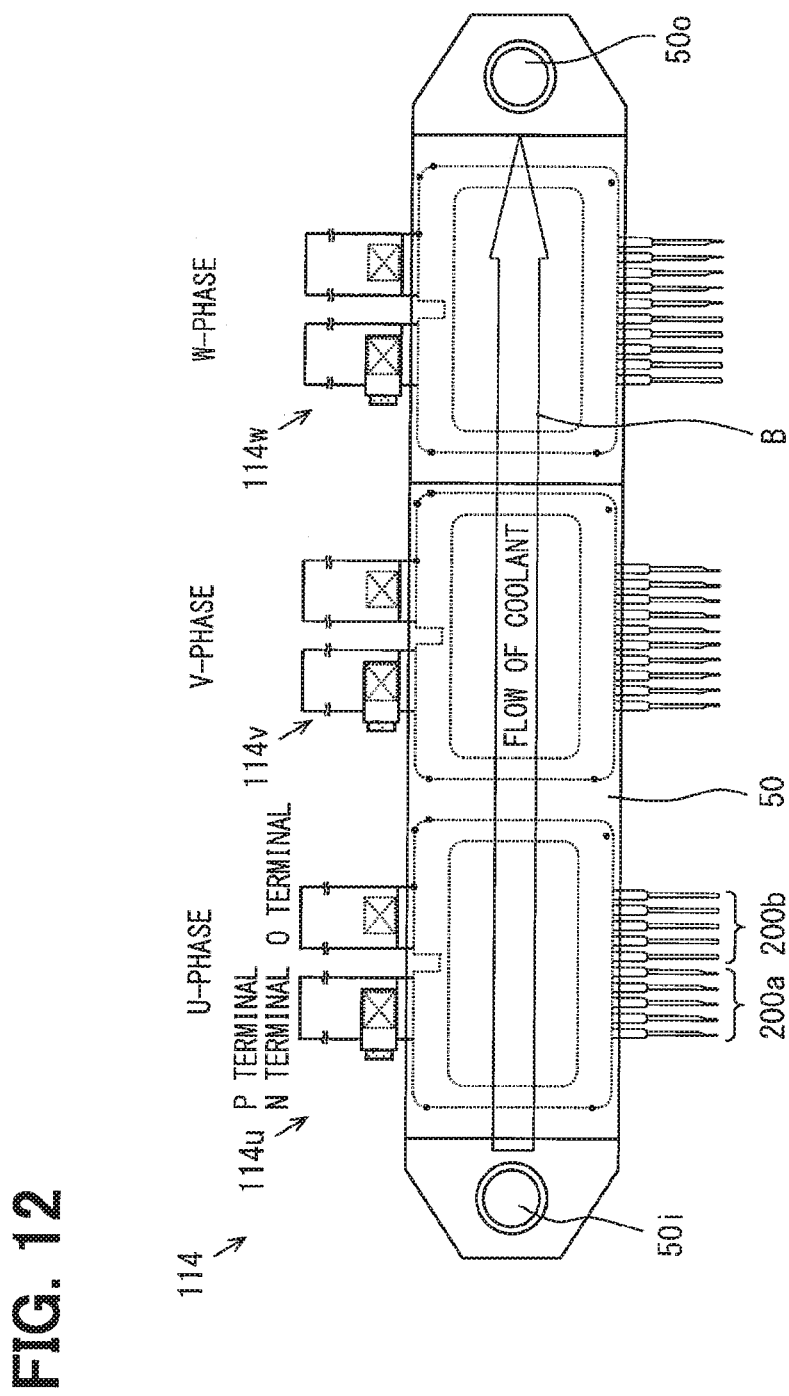
FIG. 12 is a top view of an inverter using an in-vehicle three-phase motor as a load, which is an example application of the power conversion device shown in FIG. 11A or FIG. 11B.

FIG. 12 is a top view of an inverter 114 using an in-vehicle three-phase motor as a load, which is an example application of the power conversion device shown in FIG. 11A or FIG. 11B by way of example.

The inverter 114 shown in FIG. 12 includes three power conversion devices 114u, 114v, and 114w corresponding to phases U, V, and W, respectively, each of which is of the same structure as the power conversion device 112 or 113 shown in FIG. 11A or FIG. 11B, respectively. As is shown in the drawing, the three power conversion devices 114u, 114v, and 114w are aligned in parallel on the sheet surface and configured in such a manner that two element modules as an upper arm and a lower arm forming each of the power conversion devices 114u, 114v, and 114w, are sandwiched between water-cooling coolers 50 common in all the phases as are shown in FIG. 11A or FIG. 11B. A coolant flows in from an inlet port 50i and flows out from an outlet port 50o after flowing through the water-cooling coolers 50 as indicated by an arrow B. In FIG. 12, alpha-numeral 200a denotes signal lines of the upper arm and alpha-numeral 200b denotes signal lines of the lower arm.

By laminating the configuration of FIG. 12 in multiple steps, circuits which drive multiple loads and step up and down a power-supply voltage can be provided integrally in a compact size.

As has been described, any of the power conversion devices described above is a power conversion device capable of achieving three requirements to restrict a surge voltage, ensure high radiation performance of SW elements, and restrict ringing at the same time. Hence, the power conversion devices described above are suitably employed in a vehicle for which a power conversion device having high power density and a small power loss is required and restriction of a surge voltage becomes a problem when a current, a voltage, and a SW speed of the SW elements are increased.

While the present disclosure has been described according to the embodiments above, it should be appreciated that the present disclosure is not limited to the embodiments and the structure above. The present disclosure includes various modifications and modifications within an equivalent range. Further, various combinations and embodiments, as well as other combinations and embodiments further including one element alone or more or less than one element are also within the scope and the idea of the present disclosure.

The invention claimed is:

1. A power conversion device comprising two serially-connected switching elements (hereinafter, referred to as SW elements) of an upper and a lower arm, the power conversion device supplying power to a load from a connection point of the two SW elements by converting a voltage and a current from a DC power supply, wherein:

the two SW elements are provided respectively by element modules, each of the element modules is molded with resin in a shape of a flat rectangular parallelepiped;

each of the element modules includes a heat sink connected to a positive electrode of a corresponding SW element and a heat sink connected to a negative electrode of the corresponding SW element, the heat sink connected to the positive electrode is disposed on a flat surface of the flat rectangular parallelepiped so that an outer surface thereof is exposed, and the heat sink connected to the negative electrode is disposed on an opposite flat surface of the rectangular parallelepiped so that an outer surface thereof is exposed;

each of the element modules includes a positive terminal coupled to the heat sink connected to the positive electrode of the corresponding SW element and a negative terminal coupled to the heat sink connected to the negative electrode of the corresponding SW element, and the positive terminal and the negative terminal are extracted from a lateral surface of the flat rectangular parallelepiped without overlapping in a thickness direction of the flat rectangular parallelepiped;

the element modules of the two SW elements are stacked in the thickness direction via an insulating layer in such a manner that respective lateral surfaces of the two SW elements are aligned parallel to each other in a same orientation, and the element modules are stacked such that the positive terminal of each of the element modules and the negative terminal of each of the element modules are disposed to respectively overlap each other in the thickness direction to form sets of overlapping terminals;

one set of the overlapping terminals are electrically connected in a vicinity of the lateral surfaces of the two SW elements to provide an output terminal to be connected to the load; and an other set of the overlapping terminals includes a positive terminal of the SW element of the upper arm that provides a high-potential terminal to be connected to a high potential side of the DC power supply and a negative terminal of the SW element of the lower arm that provides a low-potential terminal to be connected to a low potential side of the DC power supply.

2. The power conversion device according to claim 1, wherein:
the overlapping terminals are in a locational relation such that either one of the overlapping terminals covers the other of the overlapping terminals in the thickness direction.

3. The power conversion device according to claim 1, wherein:
the element modules of the two SW elements are of a same structure.

4. The power conversion device according to claim 1, wherein:
the positive terminal and the negative terminal of each of the element modules are extracted from the lateral surface at a same height in the thickness direction.

5. The power conversion device according to claim 4, wherein:
the positive terminal and the negative terminal of each of the element modules are extracted from one of two regions divided in the thickness direction by a bisector.

6. The power conversion device according to claim 1, wherein:
a spacer to fix an interval in the thickness direction is inserted between at least one of the sets overlapping terminals.

7. The power conversion device according to claim 1, wherein:
a groove extending through the lateral surface of the flat rectangular parallelepiped of at least one of the element modules in the thickness direction is provided between the positive terminal and the negative terminal of at least one of the element modules.

8. The power conversion device according to claim 1, wherein:
a signal line connected to a control electrode of at least one of the two SW elements is extracted from another lateral surface of the flat rectangular parallelepiped of at least one of the element modules opposing the lateral surface of the flat rectangular parallelepiped of at least one of the element modules.

9. The power conversion device according to claim 8, wherein:
the signal line of at least one of the two SW elements is extracted from the another lateral surface in one of two regions divided by a bisector in a direction orthogonal to the thickness direction.

10. The power conversion device according to claim 1, wherein:
in the other set of the overlapping terminals, a snubber circuit having a capacitor element is electrically connected adjacent to lateral surfaces between the overlapping terminals of the other set.

11. The power conversion device according to claim 10, wherein
the snubber circuit includes:
a metal member having a current path with substantially a U-shape between the at least one set of the overlapping terminals and formed with a cut portion at a midpoint; and
electrodes of the capacitor element are connected to opposite sides of the cut portion, the capacitor element being a surface-mount type.

12. The power conversion device according to claim 11, wherein:
a resistor is connected to the capacitor element in series.

13. The power conversion device according to claim 12, wherein:
the resistor is formed of a surface-mounted resistor element; and
electrodes of the resistor are connected to opposite sides of a cut portion provided to the metal member at a position different from the cut portion to which the capacitor element is connected.

14. The power conversion device according to claim 12, wherein:
the resistor is formed of a trimmed resistor portion, a sectional area of which is reduced at a midpoint of the current path by making an incision to the metal member.

15. The power conversion device according to claim 1, wherein:
the element modules of the two SW elements have a structure in which the element modules are disposed between water-cooling coolers via an insulating layer.

16. The power conversion device according to claim 1, wherein:
the power conversion device is employed in a vehicle.

* * * * *